United States Patent [19]

Echizen et al.

[11] Patent Number: 4,799,791
[45] Date of Patent: Jan. 24, 1989

[54] ILLUMINANCE DISTRIBUTION MEASURING SYSTEM

[75] Inventors: Hiroshi Echizen; Masakatsu Ota; Akiyoshi Suzuki, all of Tokyo, Japan

[73] Assignee: Canon Kabushiki Kaisha, Tokyo, Japan

[21] Appl. No.: 198,587

[22] Filed: May 23, 1988

Related U.S. Application Data

[63] Continuation of Ser. No. 106,000, Oct. 7, 1987, abandoned, which is a continuation of Ser. No. 699,201, Feb. 7, 1985, abandoned.

[30] Foreign Application Priority Data

Feb. 13, 1984 [JP] Japan .................................. 59-22892
Jan. 16, 1985 [JP] Japan .................................. 60-5355

[51] Int. Cl.$^4$ ............................................. G01J 1/00
[52] U.S. Cl. ............................................. 356/121
[58] Field of Search ............... 355/68; 356/121, 122, 356/222, 226; 382/50

[56] References Cited

U.S. PATENT DOCUMENTS

| | | | |
|---|---|---|---|
| 2,501,365 | 3/1950 | Varden | 355/68 |
| 3,480,363 | 11/1969 | Stewart | 355/68 |
| 4,193,694 | 3/1980 | Smith | 356/407 |
| 4,469,437 | 9/1984 | Yuasa et al. | 355/68 |
| 4,516,852 | 5/1982 | Liu et al. | 356/121 |

Primary Examiner—F. L. Evans
Attorney, Agent, or Firm—Fitzpatrick, Cella, Harper & Scinto

[57] ABSTRACT

Illuminance distribution measuring method and apparatus, in which the quantity of light on an area irradiated by a light beam emitted from a light source is detected by a combination of first and second detectors. The first detector is movable along the area to be irradiated and detects the quantity of irradiating light incident on the area to be irradiated while moving along the area irradiated. The second detector is fixedly secured at a predetermined position relative to the light source and the area to be irradiated and receives the light beam emitted from the light source to irradiate the area to be irradiated. On the basis of the outputs from the first and second detectors, the illuminance distribution on the area irradiated is accurately measured irrespective of any intensity changes of the light beam emitted from the light source.

20 Claims, 7 Drawing Sheets

ILLUMINANCE DISTRIBUTION MEASURING SYSTEM

This application is a continuation of application Ser. No. 106,000, filed Oct. 7, 1987, now abandoned, which was a continuation of application Ser. No. 699,201, filed Feb. 7, 1985, now abandoned.

BACKGROUND OF THE INVENTION

This invention relates to a method and an apparatus for measuring illuminance distribution and, more particularly, to a method and an apparatus for measuring illuminance distribution suitable to be used with an exposure apparatus for transferring a pattern of a mask onto a wafer at a high resolution.

Recent trend of further miniaturization of a pattern of integrated circuit (IC) or large scaled integrated circuit (LSI) has required a strictly uniform line width of the pattern of the device. Such requirement necessitates uniform distribution of irradiation energy on a transfer plane in the exposure apparatus. The illuminance distribution on the transfer plane has conventionally been measured by moving one photodetector along the transfer plane. This is because of the difficulty in manufacturing a photodetector having a large light-receiving area.

The conventional measuring method using the moving photodetector is disadvantageous in the point that changes in the luminance, with time, of the light source would directly lead to non-uniformity of the distribution of illuminance.

Conventional continuous emission type light sources such as Hg lamps usually cause only a minute amount of luminance fluctuation so that the measurement of illuminance distribution contains only a minute amount of error. However, in order to extend the service life of the light source or to achieve a higher luminance, it is possible to arrange the light source to effect pulse-like emission, e.g. by applying a higher input voltage to the lamp only during the mask pattern transfer, or to use a pulse-oscillation type laser, e.g. excimer laser, as the light source. In the case of using such pulse emission type light source, the conventional method for measuring the illuminance distribution by moving one photodetector along the transfer plane would not assure correct measurement of the illuminance distribution, because the pulses usually contain non-negligible energy fluctuation. Further, while the continuous emission type light source will cause only a minute amount of luminance change, as described above, such minute luminance change will still be non-negligible in respect to precise measurement of the illuminance distribution.

SUMMARY OF THE INVENION

It is accordingly a primary object of the present invention to provide a measuring method and a measuring apparatus capable of accurately measuring illuminance distribution irrespective of any luminance changes of a light source.

It is another object of the present invention to provide a method and an apparatus for measuring illuminance distribution with the use of at least two photodetectors, wherein any sensitivity difference between the photodetectors is compensated for, whereby accurate measurement of the illumination distribution is stably assured irrespective of any luminance changes of a light source.

Briefly, according to the present invention, there are provided illuminance distribution measuring method and apparatus, in which the quantity of light on an area irradiated by a light beam emitted from a light source is detected by a combination of first and second detectors. The first detector is movable along the area to be irradiated and detects the quantity of irradiating light incident on the area to be irradiated while moving along the area irradiated. The second detector is fixedly secured at a predetermined position relative to the light source and the area to be irradiated and receives the light beam emitted from the light source to irradiate the area to be irradiated. On the basis of the outputs from the first and second detectors, the illuminance distribution on the area irradiated is accurately measured irrespective of any intensity changes of the light beam emitted from the light source.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 3 is a schematic and diagrammatic view showing an illuminance distribution measuring system according to a further embodiment of the present invention, which is applied to a projection type exposure apparatus, wherein the system is arranged so that any sensitivity difference between two detectors is compensated for.

DESCRIPTION OF THE PREFERRED EMBODIMENTS

Figure 1:
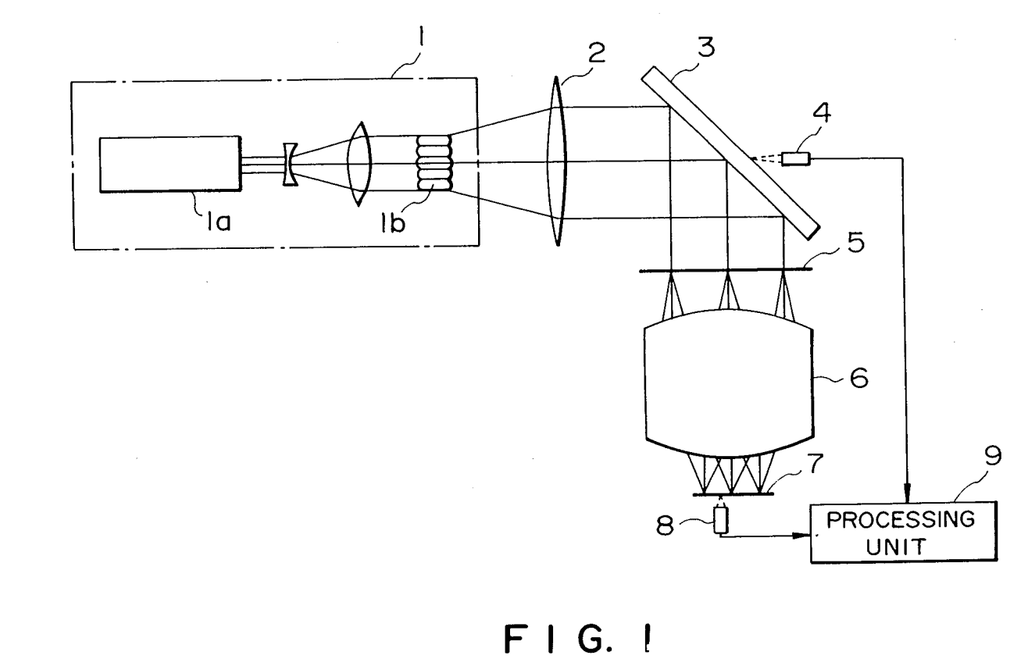
FIG. 1 is a schematic and diagrammatic view showing an illuminance distribution measuring system according to an embodiment of the present invention, which is applied to a projection type exposure apparatus.

FIG. 1 shows an illuminance distribution measuring system according to an embodiment of the present invention, which is applied to a reduction projection type exposure apparatus. In FIG. 1, reference numeral 1 designates a light source unit which includes a light source 1a, such as an excimer laser, providing a pulsed laser beam and an optical integrator 1b for defining a plurality of secondary light sources. A collimator lens 2 collimates the light emitted from the optical integrator 1b, and the collimated light beam is deflected by a flat mirror 3. The mirror 3 has a semi-transmitting portion so that a small portion of the light beam collimated by the collimator lens 2 is transmitted through the semi-transmitting portion and is received by a detector 4 for detecting a reference quantity. The detector 4 is fixedly disposed on the extension of the optical axis of the light source unit 1 to detect any luminance changes in the light emitted from the light source unit 1 and passing through the mirror 3. The light beam reflected by the mirror 3 is directed to a dummy mask 5 which is positioned in a plane in which a real mask having an actual circuit pattern is to be disposed. A projection optical system 6 is disposed between the dummy mask 5 position and a transfer plane 7 to form an image of the dummy mask 5 onto the transfer plane 7. The transfer plane 7 is a plane in which a wafer having a photoresist coating is to be disposed so that the actual circuit pattern of the real mask, when it is disposed at the dummy mask 5 position, is transferred onto the wafer surface by the projection optical system 6. Denoted by reference numeral 8 is a detector for detecting the illuminance on the transfer plane. The detector 8 has a light-receiving surface facing to the transfer plane 7 and is movable in parallel to the transfer plane 7 to measure the illuminance distribution on the transfer plane 7. Outputs of the detectors 4 and 8 are supplied to a processing unit 9 whereby the illuminance distribution is computed.

In operation, the pulse beam provided by the pulse oscillation of the light source in the light source unit 1 or the pulse beam provided by the light source and restricted by shutter (not shown) disposed in the light source unit 1 forms the secondary light sources at the output terminal or end of the light source unit 1. The diverging light beam emitted by the light source unit 1 is collimated by the collimator lens 2 and is directed to the mirror 3. Most part of the collimated light beam is deflected by the mirror 3 to irradiate the mask 5 surface. The light beam transmitted through the mask 5 is focused by the projection optical system 6 onto the transfer plane 7. Only from the viewpoint of efficiency, it is desired that the mirror 3 has a 100% reflection factor. Actually, however, the mirror 3 is arranged to have a transmission factor of approx. 1-2%. Thus, a minute amount of light is transmitted through the mirror 3 and the transmitted light is detected by the detector 4, whereby any luminance changes in the light beam emitted from the light source can be monitored. This is because the relationship between the incident light and the transmitted light is fixedly determined by the attribute of the mirror 3.

The detector 8 is initially located at a reference position for the measurement of the illuminance distribution and then is moved successively to the measuring points while the light source unit 1 is energized to provide pulses of light. By this, the illuminance at the various measuring point is monitored in synchronism with the emission of pulses. When the intensity of each pulse from the light source unit 1 changes, the illuminance on the transfer plane 7 changes accordingly. Such changes in the illuminance on the transfer plane 7 are compensated for, according to the present invention. That is, simultaneously with the successive or sequential measurement of the illuminance at various points on the transfer plane 7, the intensity of the faint light transmitted through the mirror 3 is measured by the detector 4. By this, the illuminance distribution on the transfer plane 7 can be measured accurately, independently from any intensity changes of the pulse beams emitted from the light source unit 1.

This will now be described in more detail. When, with respect to the irradiation of the pulse beam first emitted from the light source unit 1, the output of the detector 4 is represented by $S_0$ and the output and the position of the detector 8 are represented by $I_0$ and $X_0$, respectively, and when, with respect to the irradiation of any one of the pulse beams later emitted by the light source unit 1, the output of the detector 4 is represented by $S_i$ and the output and the position of the detector 8 are represented by $I_i$ and $X_i$, respectively, then the illuminance ratio $U_i$ at the position $X_i$ relative to the reference position $X_0$ can be given by:

$$U_i = (S_0/S_i) \times (I_i/I_0) (i=2, 3, \ldots) \quad (1)$$

Clearly it is found from the above equation (1) that the term $S_0/S_i$ functions to correct any illuminance change $I_i/I_0$ on the transfer plane 7 due to the change in intensity of pulse beam, occurring in the course of successive and sequential movement of the detector 8 to the measuring points on the transfer plane 7 in synchronism with the intermittent emission of the pulse beams by the light source unit 1. Therefore, the illuminance distribution can be accurately measured even if the luminance of the light source unit (or light source) 1 steeply changes during the measurement.

The processing unit 9 operates to substitute the measurement values into the above equation (1) to compute the illuminance ratio $U_i$. By connecting a number of memories to the processing unit 9, as an alternative, the reference point for the measurement of the illuminance distribution can be changed. That is, all the sequential outputs of the detectors 4 and 8 with respect to various measuring points on the transfer plane 7 are stored in these memories and, after completion of measurement, the values of $S_i$ and $I_i$ with respect to a desired position $X_i$ selected as the reference point are substituted into the equation (1) in place of $S_0$ and $I_0$ of this equation. Then, the illuminance ratio $U_i$ with respect to each of the measuring points except the point $X_i$ is calculated out.

As a further alternative, the measurement may be effected by successively computing the ratio of the output of the detector 8 relative to the output of the detector 4 and successively storing the calculation results into a memory or memories, since the illuminance ratio $U_i$ can be rewritten as follows:

$$U_i = (I_i/S_i)/(I_0/S_0) \quad (2)$$

In the present embodiment, the luminance of the light source unit 1 is measured or monitored at a position receiving a transmitted light through the mirror 3. This is however not a limitative requirement and the detector 4 may be located any other position so far as it receives the pulse beam from the light source to monitor the intensity thereof. An example is illustrated in FIG. 2.

Figure 2:
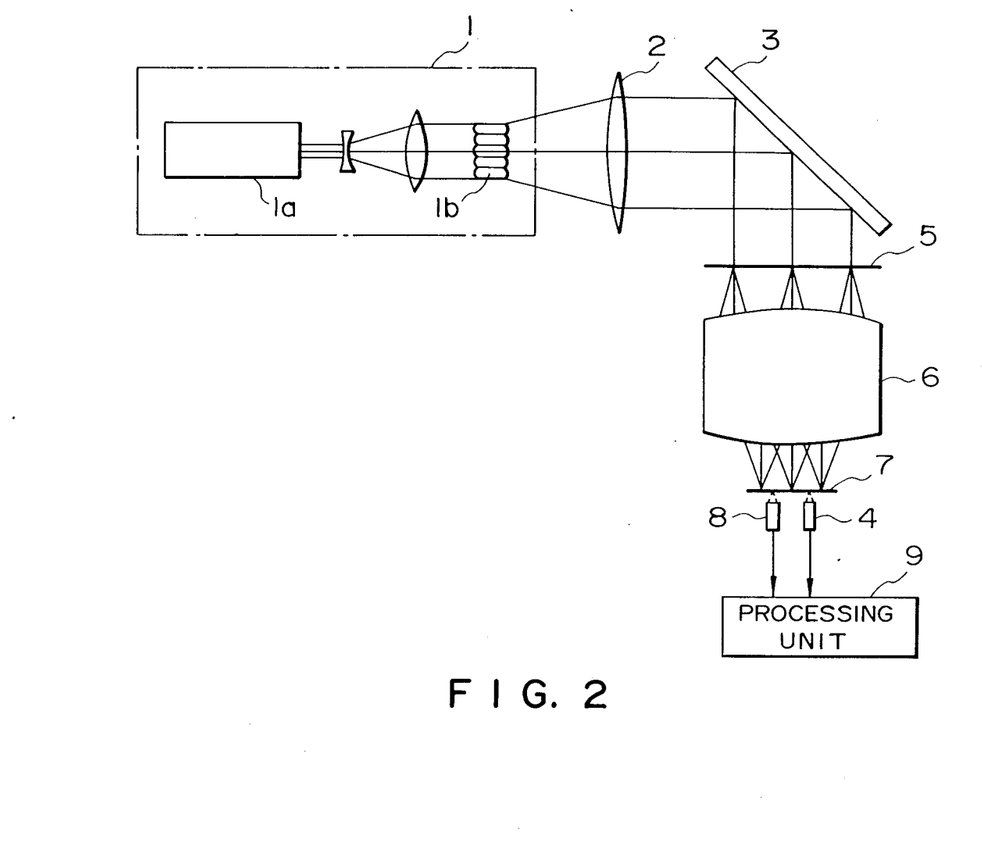
FIG. 2 is a schematic and diagrammatic view showing an illuminance distribution measuring system according to another embodiment of the present invention, which is applied to a projection type exposure apparatus.

As is shown in FIG. 2, two detectors 4 and 8 are disposed in the same plane and below the transfer plane 7 in the manner that the light-receiving portion of each of the detectors 4 and 8 faces to the transfer plane 7. One of the detectors, i.e. the detector 4 is fixedly secured for the purpose of detection of the reference illuminance, while the other detector 8 is movably disposed to detect the illuminance at each of various points on the transfer plane 7. With this arrangement, substantially the same results are attainable as the FIG. 1 arrangement. Particularly in the FIG. 2 arrangement, the flat mirror 3 can be provided by a high reflectance mirror having substantially no transmittance.

In the FIG. 2 embodiment, the detector 8 is moved along the transfer plane 7 in the manner that it does not collide against the detector 4.

Figure 3:
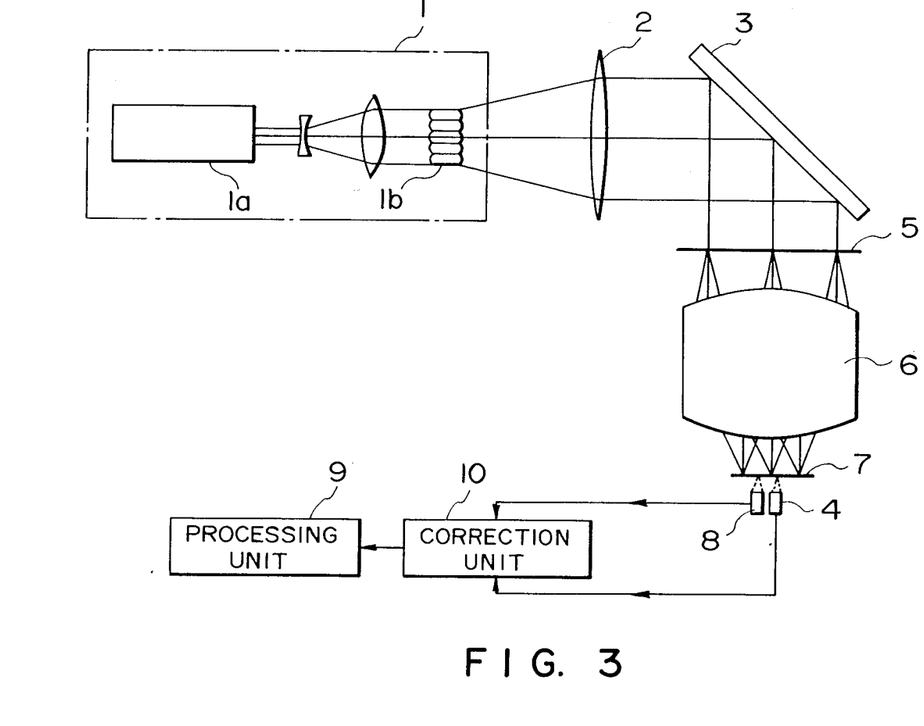

FIG. 3 shows an illuminance distribution measuring system according to a further embodiment of the present invention. The FIG. 3 embodiment is similar to the FIG. 2 embodiment except that the former is provided with an additional arrangement for detecting any sensitivity difference between two detectors 4 and 8 and for compensating such sensitivity difference.

More specifically, when the detector 8 is at a position close to the detector 4, it is expected that a uniform illuminance distribution is produced on the area of the transfer plane 7 which is close proximity to the point detected by the detector 4. If, therefore, the detectors 4 and 8 produce different outputs, it is found that there is a difference in the sensitivity to light between the detectors. Such sensitivity difference is detected and electrically compensated for by a correction unit 10. After the correction by the correction unit 10, the signals of the detectors 4 and 8 are applied to a processing unit 9, whereby a correct measurement of the illuminance distribution is effected irrespective of the sensitivity difference between the detectors 4 and 8.

Figure 4:
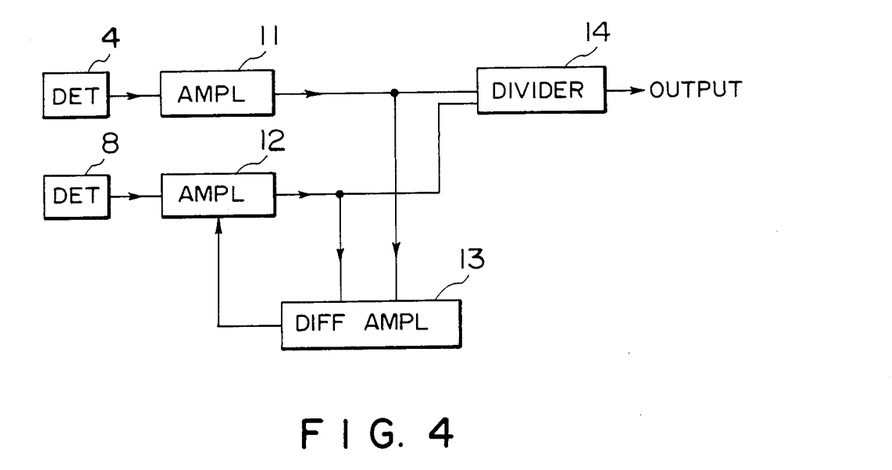
FIG. 4 is a block diagram showing a signal processing system of FIG. 3 embodiment.

FIG. 4 is a block diagram showing the signal processing in the correction unit 10 and processing unit 9.

If, when the movable detector 8 is at a position closest to the detector 4, these detectors produce different outputs, such difference is detected by a differential amplifier 13. While detecting the difference, the amplification factor of an amplifier 12 is changed relative to that of another amplifier 11 in order that the difference between the outputs of the detectors 4 and 8 is wiped out. By this, the difference in sensitivity between the detectors 4 and 8 is electrically compensated. The relative amplification factor of the amplifier 12 is fixed at the corrected level and the measurement is continued. That is, while moving the detector 8, the output ratio of the detectors 4 and 8 is detected by a divider 14 so that the illuminance distribution is obtained.

Figure 5:
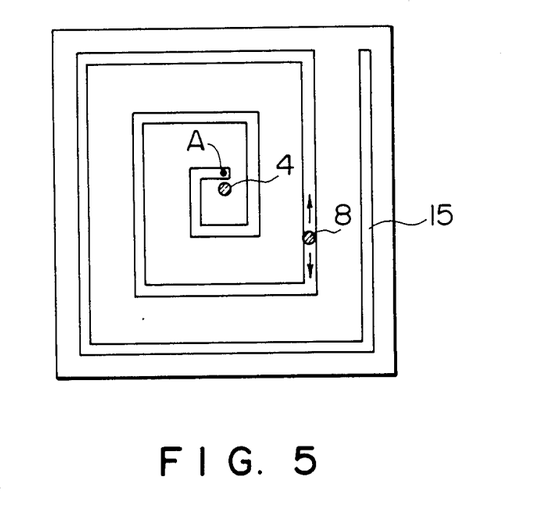
FIG. 5 is a plan view showing an example of a guide member for guiding the movement of one of the detectors of FIG. 3 embodiment.

FIG. 5 is a plan view showing an example of guide means for guiding the movement of the detector 8. The position of the detector 8 at which the relative amplification factor of the amplifier 12 (FIG. 4) is adjusted, as described above, is denoted by reference character A. At this position A, the detector 8 is closest to the fixed detector 4.

Figure 6:
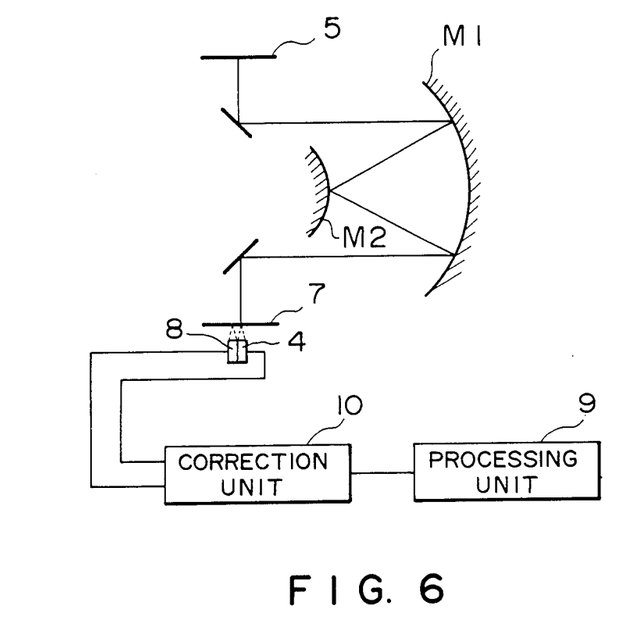
FIG. 6 is a schematic and diagrammatic view showing an illuminance distribution measuring system according to the present invention which is applied to a mirror projection type exposure apparatus.
Figure 7:
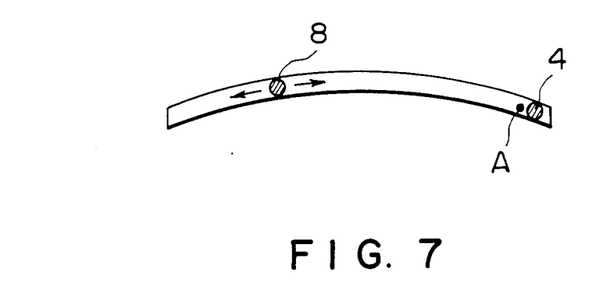
FIG. 7 is a schematic view showing an example of guide member for guiding the movement of one of the detectors of the FIG. 6 embodiment.

FIG. 6 shows an illuminance distribution measuring system according to a further embodiment of the present invention which is applied to a mirror projection type exposure apparatus. The same reference numerals as in the foregoing embodiments are assigned to the corresponding elements. In FIG. 6, the exposure apparatus includes a concave mirror M1 and a convex mirror M2, and defines an illumination area of arcuate slit shape, as is known in the art. The detector 4 is fixedly secured as in the foregoing embodiments, while the detector 8 is adapted to be moved along an arcuate path defined by guide means, such as shown in FIG. 7, to measure the illuminance distribution in the illumination area of arcuate slit shape. At the position A shown in FIG. 7, the detector 8 is juxtaposed with the fixed detector 4, whereat any sensitivity difference between the detectors 4 and 8 is detected. If there is a difference, this is electrically compensated for by a correction unit 10.

While the foregoing embodiments have been described with reference to the exposure apparatuses each having a pulse-oscillation type light source such as the excimer laser, such pulse-oscillation type light source may of course be replaced by a continuous emission type light source such as an Hg lamp.

Figure 8:
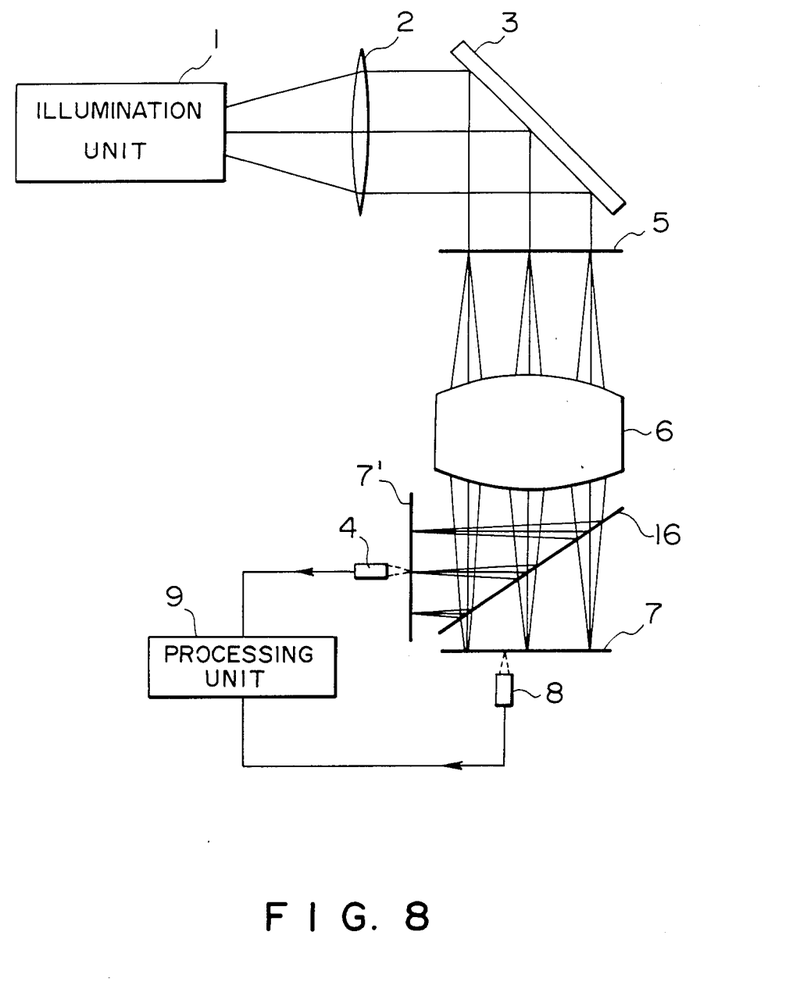
FIG. 8 is a schematic and diagrammatic view showing an illuminance distribution measuring system according to a further embodiment of the present invention, which is applied to a projection type exposure apparatus.

Although, in the embodiment shown in FIGS. 2–7, two detectors 4 and 8 are disposed in the same plane, they may be disposed in separate planes such as shown in FIG. 8.

In FIG. 8 embodiment, a semi-tranparent mirror such as a pellicle 16 is inserted between the projection optical system 6 and the transfer plane 7 so that a plane 7' which is optically conjugate with the transfer plane 7 is defined. One of the detectors, i.e. the detector 4 in this embodiment is located after the plane 7'. The detector 4 is disposed so that the light-receiving portion thereof faces to the plane 7' so as to detect the reference light quantity. With this arrangement, limitation to the geometrical design for the movement of the detector 8 owing to the presence of the detector 4 is removed, as compared with the foregoing embodiments.

Figure 9:
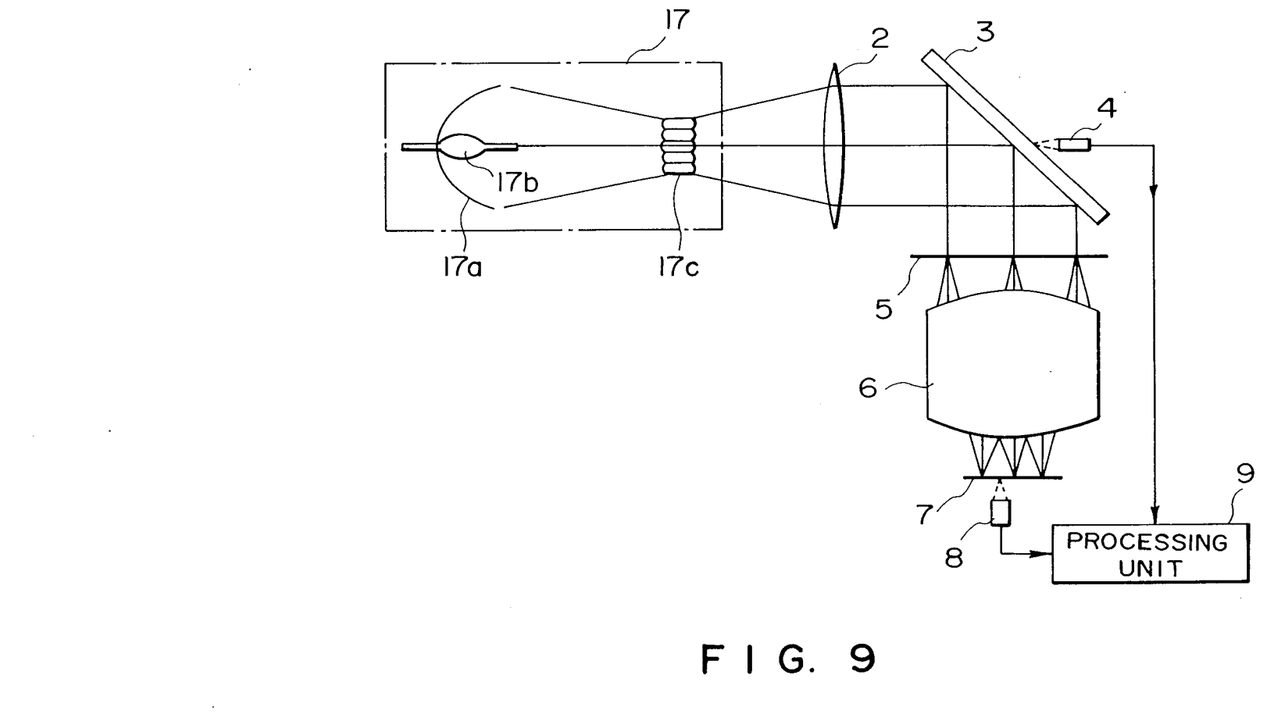
FIG. 9 is a schematic and diagrammatic view showing an illuminance distribution measuring system according to a still further embodiment of the present invention which is applied to an exposure apparatus including an Hg lamp as a light source.

FIG. 9 is an illuminance distribution measuring system according to a still further embodiment of the present invention, which is applied to a reduction projection type exposure apparatus.

The present embodiment is essentially the same as FIG. 1 embodiment except that the former employs an Hg lamp as the light source. In FIG. 9, the same reference numerals as in the foregoing embodiments are assigned to the corresponding elements. The light source unit 17 of FIG. 9 embodiment includes a mirror 17a having a curved surface of elliptic shape, a super Hg lamp or super Xe-Hg lamp 17b and an optical integrator 17c. Also in this embodiment, the luminance of the light source unit 17 is measured or monitored by a detector 4 located at a position receiving the transmitted light through the flat mirror 3 to detect the reference luminance.

While in the foregoing embodiments the present invention has been described with reference to illuminance distribution measuring systems applied to projection type exposure apparatuses, the present invention is not limited thereto and is also applicable to exposure apparatuses of contact type or proximity type.

In accordance with the present invention, as has hitherto been described, two detectors are provided, one is movable along or in parallel to the transfer plane to detect the quantity of light over the transfer plane, while the other is fixedly secured to measure or monitor any changes in the irradiation energy from the light source to detect the reference light quantity. By this, correct and accurate measurement of the illuminance distribution is assured irrespective of any intensity changes of the light emitted from the light source. This is particularly effective for the measurement of the illuminance distribution in a case where a pulse-oscillation type light source such as the excimer laser is used as the light source, since the pulse beams usually contain substantial energy fluctuation which will directly lead to uneven exposure.

While the invention has been described with reference to the structures disclosed herein, it is not confined to the details set forth and this application is intended to cover such modifications or changes as may come within the purposes of the improvements or the scope of the following claims.

What is claimed is:

1. An illuminance distribution measuring apparatus, comprising:
    first detecting means for detecting illuminance at each portion of an area irradiated by a light beam emitted from a light source, said first detecting means being movable along the area irradiated;
    second detecting means fixedly secured at a predetermined position relative to the light source and the area to be irradiated, said second detecting means receiving a portion of the light beam emitted from the light source to irradiate the area to be irradiated to detect unsteadiness of the light from the light source; and
    processing means for receiving outputs from said first and second detecting means and processing the outputs to measure the illuminance distribution on the area irradiated.

2. An apparatus according to claim 1, wherein the light beam irradiating the area to be irradiated is provided by a pulse-oscillation type light source.

3. An apparatus according to claim 2, wherein the pulse-oscillation type light source comprises an excimer laser.

4. An apparatus according to claim 1, wherein the light beam irradiating the area to be irradiated is provided by a continuous-emission type light source.

5. An apparatus according to claim 4, wherein the continuous-emission type light source comprises an Hg lamp.

6. An apparatus according to claim 1, wherein said second detecting means has a light-receiving surface facing the area to be irradiated.

7. An apparatus according to claim 1, wherein said second detecting means has a light-receiving surface arranged to receive a light beam split by a beam splitting means for changing the optical axis from the light source to the area to be irradiated.

8. An apparatus according to claim 1, wherein said second detecting means has a light-receiving surface facing a plane optically conjugate with the area to be irradiated.

9. An apparatus according to claim 1, wherein the area to be irradiated is of arcuate slit shape.

10. An illuminance distribution measuring apparatus, comprising:
    first detecting means for detecting the quantity of light, on an area irradiated by a light beam emitted from a light source, while said first detecting means moves along the area irradiated;
    second detecting means fixedly disposed so that a light-receiving surface thereof faces a predetermined portion of the area to be irradiated to detect unsteadiness of the light from the light source;
    correcting means for correcting any sensitivity difference between said first and second detecting means; and
    processing means for receiving outputs of said first and second detecting means and processing the outputs to measure the illuminance distribution of the area irradiated.

11. An apparatus according to claim 10, wherein said first detecting means is movable along a guide.

12. An apparatus according to claim 10, wherein said correcting means corrects the sensitivity difference between the first and second detecting means when said first detecting means is at a position close to said second detecting means.

13. An apparatus according to claim 10, wherein the light beam irradiating the area to be irradiated is provided by a pulse-oscillation type light source.

14. An apparatus according to claim 13, wherein the pulse-oscillation type light source comprises an excimer laser.

15. An apparatus according to claim 10, wherein the light beam irradiating the area to be irradiated is provided by a continuous emission type light source.

16. An apparatus according to claim 15, wherein the continuous emission type light source comprises an Hg lamp.

17. An apparatus according to claim 10, wherein the area to be irradiated is of arcuate slit shape.

18. An illuminance distribution measuring method, comprising:
    moving a first detecting means, for detecting the quantity of light on an area irradiated by a light beam while the first detecting means moves along the area, to a position close to a second detecting means, said second detecting means fixedly disposed and having a light-receiving surface facing a predetermined portion of the area to be irradiated to detect unsteadiness of the light from the light source;
    correcting, when said first detecting means is at said position, at least one of the outputs of said first and second detecting means so that the outputs of said first and second detecting means have substantially the same level;
    detecting the quantity of light on the area irradiated while moving said first detector away from said second detecting means and along the area irradiated; and
    processing the outputs of said first and second detecting means to measure the illuminance distribution on the area irradiated.

19. An illuminance distribution measuring apparatus, comprising:
    first detecting means movable substantially along an area to be irradiated by a light beam from a light source, for detecting illuminance at each portion of the area being irradiated by the light beam from the light source;
    second detecting means fixedly secured at a predetermined position relative to the light source and the area to be irradiated, said second detecting means receiving a portion of the light beam from the light source to detect unsteadiness of the light from the light source; and
    processing means for receiving outputs of said first and second detecting means and processing them so as to compensate for a change in illuminance on the area being irradiated which may occur between the detection by said first detecting means with respect to one portion of the area being irradiated and the detection by said first detecting means with respect to another portion of the area being irradiated, to thereby measure the illuminance distribution on the area being irradiated.

20. An illuminance distribution measuring apparatus for measuring an illuminance distribution on a region irradiated with pulsed light from a pulse-oscillation type light source, said apparatus comprising:

first detecting means for detecting, in sequence, the illuminance at different locations in said region which is being irradiated with plural pulses of light emitted by said light source, and for producing a signal representing the detection;

second detecting means for receiving a portion of each light pulse, emitted by said light source toward said region, to detect unsteadiness of the pulsed light from said light source, and for producing a signal representing the detection; and processing means for receiving the signals produced by said first and second detecting means and for processing the signals to measure the illuminance distribution on said region.

* * * * *

UNITED STATES PATENT AND TRADEMARK OFFICE
CERTIFICATE OF CORRECTION

PATENT NO. : 4,799,791
DATED : January 24, 1989
INVENTOR(S) : HIROSHI ECHIZEN, ET AL.

Page 1 of 2

It is certified that error appears in the above-identified patent and that said Letters Patent is hereby corrected as shown below:

Title page:

IN [56] REFERENCES CITED

U.S. PATENT DOCUMENTS, "4,516,852  5/1982  Liu et al." should read --4,516,852  5/1985  Liu et al.--.

COLUMN 1

Line 18, "large scaled" should read --large-scale--.
Line 54, "INVENION" should read --INVENTION--.

COLUMN 2

Line 46, "of FIG. 3" should read --of the FIG. 3--.
Line 52, "guide member" should read --a guide member--.

COLUMN 3

Line 39, "shutter" should read --a shutter--.
Line 64, "point is" should read --points are--.

COLUMN 6

Line 19, "semi-transparent" should read --semitransparent--.

UNITED STATES PATENT AND TRADEMARK OFFICE
CERTIFICATE OF CORRECTION

PATENT NO. : 4,799,791
DATED : January 24, 1989
INVENTOR(S) : HIROSHI ECHIZEN, ET AL.   Page 2 of 2

It is certified that error appears in the above-identified patent and that said Letters Patent is hereby corrected as shown below:

COLUMN 8

Line 18, "continuous emission" should read --continuous-emission--.
Line 20, "continuous emission" should read --continuous-emission--.
Line 41, "said first detector" should read --said first detecting means--.

Signed and Sealed this

Seventeenth Day of April, 1990

*Attest:*

HARRY F. MANBECK, JR.

*Attesting Officer*   *Commissioner of Patents and Trademarks*